United States Patent [19]
Nakagawa

[11] Patent Number: 6,080,928
[45] Date of Patent: Jun. 27, 2000

[54] PHOTOVOLTAIC ELEMENT ARRAY AND METHOD OF FABRICATING THE SAME

[75] Inventor: Katsumi Nakagawa, Nara, Japan

[73] Assignee: Canon Kabushiki Kaisha, Tokyo, Japan

[21] Appl. No.: 08/711,655

[22] Filed: Sep. 9, 1996

[30] Foreign Application Priority Data

Sep. 11, 1995 [JP] Japan ..................... 7-233083

[51] Int. Cl.⁷ .................................. H01L 31/05
[52] U.S. Cl. .................. 136/249; 136/255; 136/258; 257/436; 257/443; 438/73; 438/80
[58] Field of Search ............... 257/54, 53, 431, 257/436, 443; 313/252, 258, 260, 261, 243, 244, 249; 438/73, 80

[56] References Cited

U.S. PATENT DOCUMENTS

| | | | |
|---|---|---|---|
| 4,254,386 | 3/1981 | Nemit et al. | 333/128 |
| 4,292,092 | 9/1981 | Hanak | 148/1.5 |
| 4,369,730 | 1/1983 | Izu et al. | 118/723 |
| 4,410,558 | 10/1983 | Izu et al. | 427/39 |
| 4,419,533 | 12/1983 | Czubatyj et al. | 136/259 |
| 4,594,471 | 6/1986 | Yamazaki | 136/249 |
| 4,697,041 | 9/1987 | Okaniwa et al. | 136/244 |
| 4,826,777 | 5/1989 | Ondris | 437/2 |

OTHER PUBLICATIONS

Patent Abstracts of Japan, vol. 10, No. 082 (E–392), Apr. 1986 of JP 60–227484.
Patent Abstracts of Japan, vol. 13, No. 272 (E–777), Jun. 1989 of JP–061963.

*Primary Examiner*—Jerome Jackson, Jr.
*Assistant Examiner*—Bradley William Baumeister
*Attorney, Agent, or Firm*—Fitzpatrick, Cella, Harper and Scinto

[57] ABSTRACT

An insulating film is formed on a conductive substrate, a conductor film is deposited on the insulating film, and a plurality of first electrodes are formed by forming at least one groove in the conductor film. A transparent layer is so formed as to cover the first electrodes and bury the groove formed in the conductor film. A photovoltaic layer is formed on the transparent layer, and an ITO film is deposited on the photovoltaic layer. A plurality of second electrodes are formed by forming at least one groove in the ITO film in parallel with the groove formed in the conductor film. A groove or a hole extending through at least the photovoltaic layer is formed between the two parallel grooves, and a conductive material is filled in this groove or hole, thereby electrically connecting the first and second electrodes adjacent to each other. Since the groove for separating the adjacent first electrodes is buried with the transparent layer, no defects occur due to the step in the groove. Accordingly, it is possible to provide a series photovoltaic element array with a high conversion efficiency, a high yield, and a high reliability.

17 Claims, 10 Drawing Sheets

FIG. 9

| O₂ FROW RATE RATIO | RESISTIVITY OF ZnO (Ωcm) | CHARACTERISTICS OF SAMPLE | REMARKS |
|---|---|---|---|
| 0 | 0.7 | △ | Voc WAS LOW |
| 1% | 7 | ○ | |
| 2% | 36 | ◎ | |
| 3% | 105 | ◎ | |
| 5% | 440 | ○ | |
| 8% | 1.1k | △ | FF (FILL FACTOR) WAS LOW |

◎ = EQUIVALENT TO STANDARD SAMPLE (CONVERSION EFFICIENCY WAS 95% OR MORE OF STANDARD SAMPLE).

○ = NEARLY EQUIVALENT TO STANDARD SAMPLE (CONVERSION EFFICIENCY WAS 95 TO 80% OF STANDARD SAMPLE).

△ = UNSATISFACTORY (CONVERSION EFFICIENCY WAS 80 TO 50% OF STANDARD SAMPLE).

FIG. 10

| | YIELD | AVERAGE OF CHARACTERISTICS OF TOP THREE SAMPLES |
|---|---|---|
| SAMPLE 1 | 10 / 10 | ◎ |
| SAMPLE 2 | 3 / 10 | ◎ |
| SAMPLE 3 | 7 / 10 | △ |

◎ = EQUIVALENT TO STANDARD SAMPLE (CONVERSION EFFICIENCY WAS 95% OR MORE OF STANDARD SAMPLE).

○ = NEARLY EQUIVALENT TO STANDARD SAMPLE (CONVERSION EFFICIENCY WAS 95 TO 80% OF STANDARD SAMPLE).

△ = UNSATISFACTORY (CONVERSION EFFICIENCY WAS 80 TO 50% OF STANDARD SAMPLE).

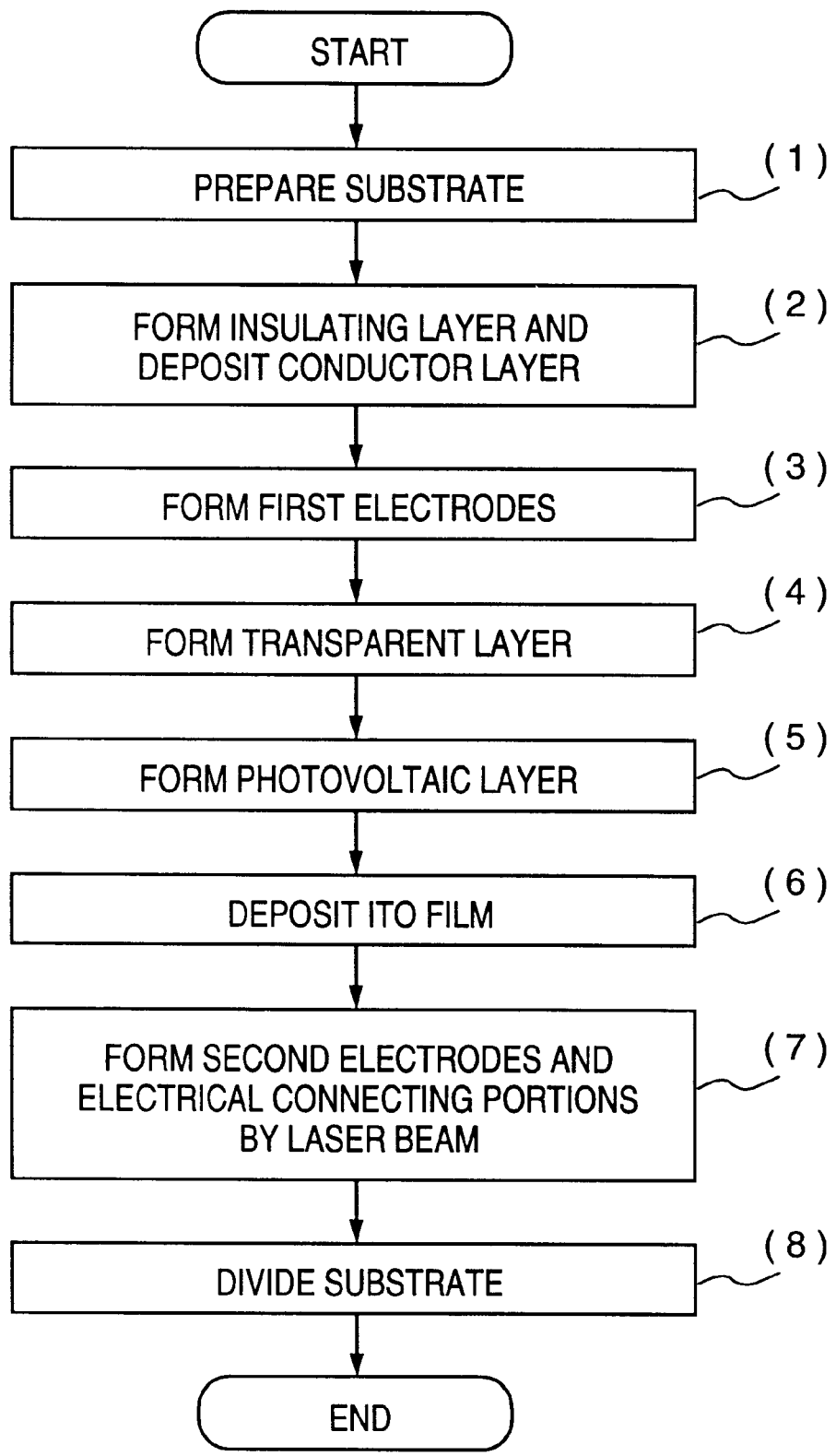

PHOTOVOLTAIC ELEMENT ARRAY AND METHOD OF FABRICATING THE SAME

BACKGROUND OF THE INVENTION

1. Field of the Invention

The present invention relates to a photovoltaic element array and a method of fabricating the same and, more particularly, to a photovoltaic element array capable of reducing decreases in yield and reliability caused by the formation of a transparent layer and a method of fabricating the same.

2. Description of Related Art

Petroleum and coal are said to bring about anathermal of the earth because they produce carbon dioxide when used, and it cannot be said that atomic power is perfectly secure from radiation when an unforeseen accident occurs or even during a normal operation. Therefore, complete dependence upon these sources as energy sources in the future is very dangerous. On the other hand, a more spread of solar batteries using solar light as an energy source is being expected since they have almost no influence on the terrestrial environment. However, the following problems are preventing a full-scale spread of the solar batteries.

Monocrystalline or polycrystalline silicon is in many instances used as the material for solar light electric power generation. However, solar batteries using these materials require a larger energy and a long time to grow a crystal and complicated steps after that. The result is that a mass-production effect is difficult to achieve and therefore it is difficult to provide inexpensive batteries. This is called a problem A.

To solve this problem A, so-called thin-film semiconductor solar batteries using amorphous silicon (to be referred to as "a-Si" hereinafter) or compound semiconductors such as CdS and $CuInSe_2$ are being extensively researched and developed. The thin-film semiconductor solar batteries can be formed by using inexpensive substrates such as glass, stainless steel, and aluminum substrates, and only functionally necessary semiconductor layers need to be formed on these substrates. Therefore, the fabrication steps are relatively simple and the amount of semiconductors used is small. Thus the thin-film semiconductor solar batteries have the advantage of being producible at a low cost.

Generally, however, the output voltage of each single element is low in these thin-film semiconductor solar batteries. This leads to a problem B that it is necessary to connect a plurality of elements in series to increase the output voltage for most application purposes.

To solve this problem B, in thin-film semiconductor solar batteries, an array of photovoltaic elements connected in series must be formed on the same substrate. The following three patents can be enumerated as well-known techniques of fabricating this series photovoltaic element array.

(a) U.S. Pat. No. 4,254,386 (filing data: Jun. 13, 1976) has disclosed the structure of a series photovoltaic element array in which divided first electrodes, divided thin-film semiconductor photovoltaic layers (PN junction), and divided second electrodes are formed on an insulating substrate.

(b) U.S. Pat. No. 4,292,092 (filing data: Sep. 29, 1981) has disclosed a method which uses a laser beam as a means for dividing a conductive layer and a semiconductor photovoltaic layer.

(c) U.S. Pat. No. 4,697,041 (filing data: Feb. 10, 1986) has disclosed a method which uses a laser beam as a means for electrically connecting a first electrode and a second electrode.

It is pointed out that series photovoltaic element arrays can be produced at a low cost by the use of these methods since individual layers can be easily divided and photovoltaic elements can be easily connected in series in these methods.

Unfortunately, the techniques disclosed in the above patents (a) to (c) have a problem C that a usable substrate is restricted to an insulating film and this limits the degree of freedom of choice of substrates.

Also, when a thin-film semiconductor is used, a roll substrate can be used if a flexible long substrate disclosed in U.S. Pat. No. 4,369,730 (filing data: Mar. 16, 1981) is used. This is suitable for continuous mass-production of solar batteries.

In principle, an insulating resin film can be used as a flexible substrate. However, a substrate must be heated to at least 200° C. to form a thin-film semiconductor with good characteristics. Accordingly, common resin films are difficult to use because they fuse, deform, or release gases when heated. This is a problem D. Although there is a film such as a polyimide film having a high heat resistance, this film is difficult to process and expensive. This is a problem E.

To solve these problems D and E, thin metal plates such as a stainless steel plate and an aluminum plate are put into practical use as flexible long substrates. Since a metal substrate has conductivity, however, it is necessary to form a series photovoltaic element array after an insulating film is formed on the surface of the substrate.

As a method of solving this problem, U.S. Pat. No. 4,410,558 (filing data: Mar. 16, 1981) has disclosed a technique of fabricating a series photovoltaic element array by forming an anodized layer on an aluminum substrate.

Meanwhile, U.S. Pat. No. 4,419,533 (filing date: Mar. 3, 1982) has disclosed a method of forming a back reflecting layer to increase the efficiency of a photovoltaic element.

Solar light incident through a transparent second electrode is absorbed by a photovoltaic layer to generate electric power. However, there is a problem F that some light components, particularly those having long wavelengths, are not absorbed by the photovoltaic layer. The leakage light from the photovoltaic layer reaches a first electrode. Therefore, a technique of increasing the light utilization is proposed by which a metal with a high reflectance is used as the first electrode, and the leakage light from the photovoltaic layer is returned by this metal layer to the photovoltaic layer and absorbed by it. When a transparent layer is additionally formed between the first electrode layer and the photovoltaic layer, the reflectance of the first electrode is further increased by an optical action. Furthermore, when corrugations are formed at a pitch of the wavelength of light on the surfaces of the first electrode and/or the transparent layer, solar light is confined inside the photovoltaic layer, and this significantly increases the absorption to the photovoltaic layer. The first electrode and the transparent layer having this action are collectively called a back reflecting layer. The back reflecting layer is also effective to a series photovoltaic element array.

Generally, however, the transparent layer is regarded as a part of the first electrode and is patterned to form grooves together with the first electrode. Consequently, a step is raised by the thickness of the transparent layer and this readily causes defects in the photovoltaic layer formed on it. This degrades the yield and reliability of a solar battery. Accordingly, it is considered that the back reflecting layer is practically difficult to apply to a series photovoltaic element array although this is desirable to improve the efficiency.

The details of the problems of a series photovoltaic element array fabricated by forming the transparent layer on the basis of the above viewpoint will be described below.

(1) Defects readily occur in the steps of grooves formed in the transparent layer:

Although the resistivity of the transparent layer is not as low as that of a metal, it is much lower than that of the photovoltaic layer. Therefore, to electrically separate the first electrode, it is necessary to form grooves of the same pattern as the first electrode. However, the transparent layer generally has a thickness of about 0.1 to 1.0 μm. Accordingly, when the thickness is at most about 0.5 μm as in the case of an a-Si photovoltaic layer, poor step coverage occurs to easily cause defects.

(2) Grooves are difficult to form in the transparent layer by laser processing:

Since the transparent layer is transparent to a YAG laser (wavelength=1.06 or 0.53 μm) often used in the processing of solar batteries, a considerable beam intensity is required to form grooves in the transparent layer. When grooves are formed by a laser beam with a high beam intensity, however, the laser beam reaches an insulating layer and damages the insulating layer. This causes short circuits to easily occur between the first electrode and the substrate.

For the reasons (1) and (2) described above, the development of a technique capable of reducing decreases in yield and reliability caused by the formation of the transparent layer is being desired.

SUMMARY OF THE INVENTION

It is an object of the present invention to provide a photovoltaic element array capable of reducing decreases in yield and reliability caused by the formation of a transparent layer and therefore usable as a highly efficient, inexpensive, and highly reliable solar battery, and a method of fabricating the same.

To achieve the above object, a preferred embodiment of the present invention discloses a device in which a plurality of photovoltaic elements are connected in series, comprising a conductive substrate, an insulating layer formed on said substrate, a first conductor layer formed on said insulating layer and divided into a plurality of first electrodes by at least one first groove, a transparent layer so formed as to cover said first conductor layer and bury said first groove, a photovoltaic layer formed on said transparent layer, a transparent second conductor layer formed on said photovoltaic layer and divided into a plurality of second electrodes by at least one second groove parallel to said first groove, and at least one connecting portion for electrically connecting said first and second electrodes adjacent to each other between said first and second grooves.

Also, the preferred embodiment of the present invention discloses a process for fabricating a device in which a plurality of photovoltaic elements are connected in series, comprising the steps of forming an insulating layer on a conductive substrate, forming a first conductor layer on said insulating layer, forming at least one groove in said first conductor layer to divide said first conductor layer into a plurality of first electrodes, forming a transparent layer so that said transparent layer covers said first conductor layer and buries said first groove, forming a photovoltaic layer on said transparent layer, forming a transparent second conductor layer on said photovoltaic layer, forming at least one second groove parallel to said first groove in said second conductor layer to divide said second conductor layer into a plurality of second electrodes, and forming at least one connecting portion for electrically connecting said first and second electrodes adjacent to each other between said first and second grooves.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 9 is a view showing the characteristic evaluation results of a series photovoltaic element array having the structure shown in FIG. 2;

FIG. 10 is a view showing the evaluation results of the influence of the formation of a transparent layer on the yield;

FIG. 13 is a flow chart showing a procedure of fabricating a photovoltaic element array of the third embodiment.

DESCRIPTION OF THE PREFERRED EMBODIMENTS

A photovoltaic element array according to the present invention will be described below. To simplify the explanation, a partial sectional structure (FIG. 1) of a series photovoltaic element array in which a transparent layer is formed on the basis of the viewpoint of the present invention is compared with a partial sectional structure (FIG. 8) of a series photovoltaic element array in which a transparent layer is formed on the basis of the above conventional viewpoint.

Structures of Photovoltaic Element Arrays

Figure 1:
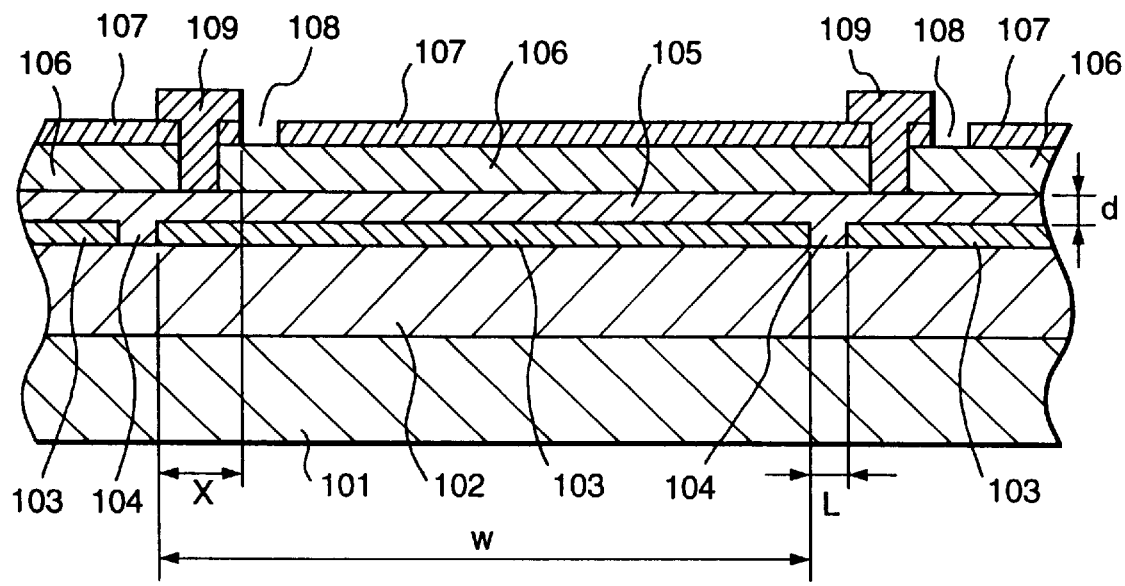
FIG. 1 is a view showing a partial sectional structure of a series photovoltaic element array in which a transparent layer is formed after the formation of first electrodes.

In FIG. 1 (FIG. 8), an insulating layer 102 (802) is deposited on a substrate 101 (801) made of a thin metal plate so as to cover the whole substrate. First electrodes 103 (803) are deposited on this insulating layer 102 (802). The first electrodes are completely separated by grooves 104 (804). The first electrodes 103 (803) can be either transparent or opaque, like a metal, to light. Furthermore, to effectively use incident solar light as described previously, a transparent layer 105 (805) is deposited on the first electrodes 103 (803).

Figure 8:
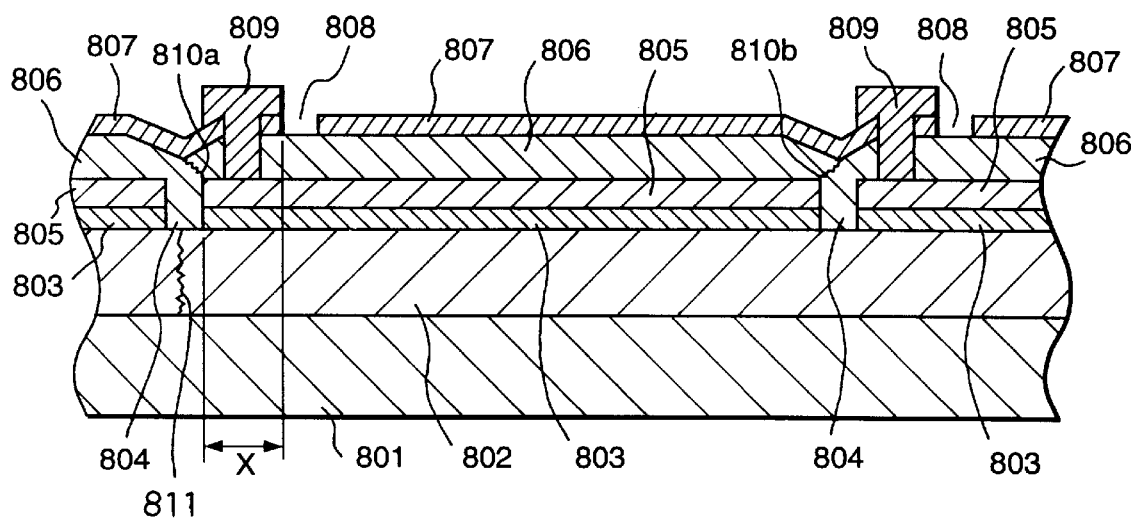
FIG. 8 is a view showing a partial sectional structure of a series photovoltaic element array in which first electrodes are formed after the formation of a transparent layer.

In the conventional viewpoint described previously, the resistivity of the transparent layer 805 is lowered in order to allow an easy flow of an output current from a photovoltaic layer 806. In FIG. 8, therefore, the transparent layer 805 is also completely separated by the same pattern as the first electrodes 803 in order to electrically separate the first electrodes 803.

On the other hand, in the structure of the present invention shown in FIG. 1, no grooves are formed in the transparent layer 105, i.e., the transparent layer 105 completely covers the first electrodes 103 and the grooves 104.

A photovoltaic layer 106 (806) made from a semiconductor is deposited on the transparent layer 105 (805). The semiconductor photovoltaic layer 106 (806) contains a P-N junction, a PIN junction, or a Schottky junction and generates a photovoltaic effect.

Additionally, transparent second electrodes 107 (807) are deposited on the photovoltaic layer 106 (806). The second electrodes are completely separated by grooves 108 (808). These grooves 108 (808) are formed in different positions from the grooves 104 (804) in the direction of plane of the substrate 101 (801), and a region with a very small width X is formed between the grooves 104 (804) and 108 (808).

Furthermore, a conductive material 109 (809) is filled in grooves (or holes) formed through the second electrodes 107 (807) and the photovoltaic layer 106 (806). This conductive material 109 (809) electrically connects the first electrodes 103 (803) and the second electrodes 107 (807).

Operation of Photovoltaic Element Array

The operation of the series photovoltaic element array shown in FIG. 1 will be described below.

The photovoltaic layer 106 absorbs light incident from the second electrodes 107 and generates a photovoltaic effect. Consequently, a potential difference V is generated between the opposing first and second electrodes 103 and 107. Since the first and second electrodes 103 and 107 adjacent to each other are set at substantially the same potential by the connecting portion 109, the potential difference between the adjacent first electrodes 103 and the adjacent second electrodes 107 rises step by step by nearly V. FIG. 1 illustrates only part of a simple photovoltaic element array. In practice, however, a structure like this is repeatedly formed a necessary number of times in accordance with a required output voltage.

The series photovoltaic element array shown in FIG. 8 has the same function as above.

Problems of Structure Shown in FIG. 8

The steps of the grooves 804 in FIG. 8 are larger than those of the grooves 104 in FIG. 1 by the thickness of the transparent layer 805, and so short circuits readily occur in these steps. For example, a short circuit 810a connecting the transparent layer 805 and the second electrode 807 adjacent to each other has no influence since this short circuit 810a functions in the same manner as the conductive filler 809. However, a short circuit 810b connecting the transparent layer 805 and the second electrode 807 opposite to each other short-circuits the first electrode 803 and the second electrode 807 opposite to each other. Consequently, this short circuit 810b significantly degrades the characteristics of the series photovoltaic element array.

Also, since the transparent layer 805 is transparent, the intensity of a laser beam must be raised when the grooves are formed in the transparent layer 805 by the laser beam. This sometimes damages the insulating layer 802, resulting in an easy formation of a short circuit 811 connecting the photovoltaic layer 806 and the substrate 801.

Advantages of Structure Shown in FIG. 1

On the other hand, in the structure shown in FIG. 1, the steps of the grooves 104 are low because the grooves 104 are formed only in the first electrodes 103. This makes it difficult to form a short circuit such as the short circuit 810a or 810b shown in FIG. 8. Additionally, since the grooves 104 can be formed before the formation of the transparent layer 105, the intensity of a laser beam required to form the grooves 104 can be low. This makes it difficult to form a short circuit in the insulating layer 102.

Furthermore, steps formed when the first electrodes 103 are formed or short circuits formed in the insulating layer 102 (although these steps and short circuits are much smaller than those in the structure shown in FIG. 8) are completely covered with the transparent layer 105. Accordingly, defects hardly occur in the photovoltaic layer 106 due to these steps, or short circuits between the photovoltaic layer 106 and the substrate 101 can be suppressed.

Since, however, the transparent layer 105 is formed across the groove 104 for separating the adjacent first electrodes 103, there is the possibility that a leakage current flows between these electrodes to degrade the characteristics of the series photovoltaic element array. On the other hand, if the resistivity of the transparent layer 105 is high, this interferes with the flow of a current between the photovoltaic layer 106 and the first electrodes 103. This also degrades the characteristics of the series photovoltaic element array.

The characteristics that the transparent layer 105 must have will be described below. Assume that the characteristic at an optimum operating point of a unit element is output power Vop×Jop=9.0 mW/cm$^2$, i.e., conversion efficiency η=9.0%, when output voltage Vop=0.6 V and output current Jop=15 MA/cm$^2$ under irradiation of a solar simulator having AM-1.5, by which condition the zenith distance is 48°, and a radiant flux of 100 mW/cm$^2$.

(i) Assuming that the resistivity and thickness of the transparent layer 105 are ρ[Ωcm] and d [cm], respectively, the resistance per 1 cm$^2$ in the direction of thickness is ρ·d [Ω]. The energy loss produced by this resistance is Jop$^2$·ρ·d [W]. In order for this energy loss to be 1% or less of output Vop·Jop [W] per 1 cm$^2$, the energy loss must satisfy $$Jop^2 \cdot \rho \cdot d < 0.01 \cdot Vop \cdot Jop$$

That is, assuming d=0.1 μm (=10$^{-5}$ cm), $$\rho < (0.01 \cdot Vop)/(Jop \cdot d)$$
$$= (0.01 \times 0.6)/(15 \times 10^{-3} \times 10^{-5})$$
$$= 40 \text{ k}\Omega\text{cm}$$

(ii) On the other hand, when the width of the groove 104 between the adjacent first electrodes 103 is L [cm], the leakage resistance between the first electrodes 103 is ρ·L/d [Ω] per 1 cm parallel to the groove 104. The leakage current is Vop·d/(ρ·L) [A] and the energy loss is Vop$^2$·d/(ρ·L) [W]. When the width of the first electrode 103 is w [cm], the output energy generated from an area of w×1 [cm$^2$] is w·Vop·Jop [W]. In order for the energy loss resulting from the leakage to be 1% or less of the output energy, the energy loss must satisfy $$Vop^2 \cdot d/(\rho \cdot L) < 0.01 \cdot w \cdot Vop \cdot Jop$$

That is, assuming L=100 μm (=$10^{-2}$ cm) and w=1 cm, $$\rho > (Vop \cdot d)/(0.01 \cdot L \cdot W \cdot Jop)$$

$$= (0.6 \times 10^{-5})/(0.01 \times 10^{-2} \times 1 \times 15 \times 10^{-3})$$

$$= 4 \, \Omega cm$$

That is, the transparent layer 105 having a resistivity within the range of 4 Ωcm<ρ<40 kΩcm can satisfy both the conditions (i) and (ii). Therefore, the influence on the characteristics of the series photovoltaic element array is negligible.

Second Structure

A photovoltaic element array according to the present invention shown in FIG. 2 having a different structure from that shown in FIG. 1 will be described below. In this second structure, a conductive material 109 is filled in grooves (or holes) formed through second electrodes 107, a photovoltaic layer 106, and a transparent layer 105, thereby electrically connecting first electrodes 103 and the second electrodes 107 adjacent to each other. That is, in the second structure, the first and second electrodes 103 and 107 adjacent to each other are directly connected. This completely suppresses the energy loss capable of being generated in the connecting portion by the resistance in the transparent layer 105. Also, the grooves (or holes) need not be formed through the transparent layer 105, i.e., can be formed only to the middle of the transparent layer 105. This results in a wide latitude in the formation of the grooves (or holes).

Confirmation of Effects

The experiments conducted to confirm the effects of the present invention and the results of the experiments will be described below.

Experiment 1

Figure 2:
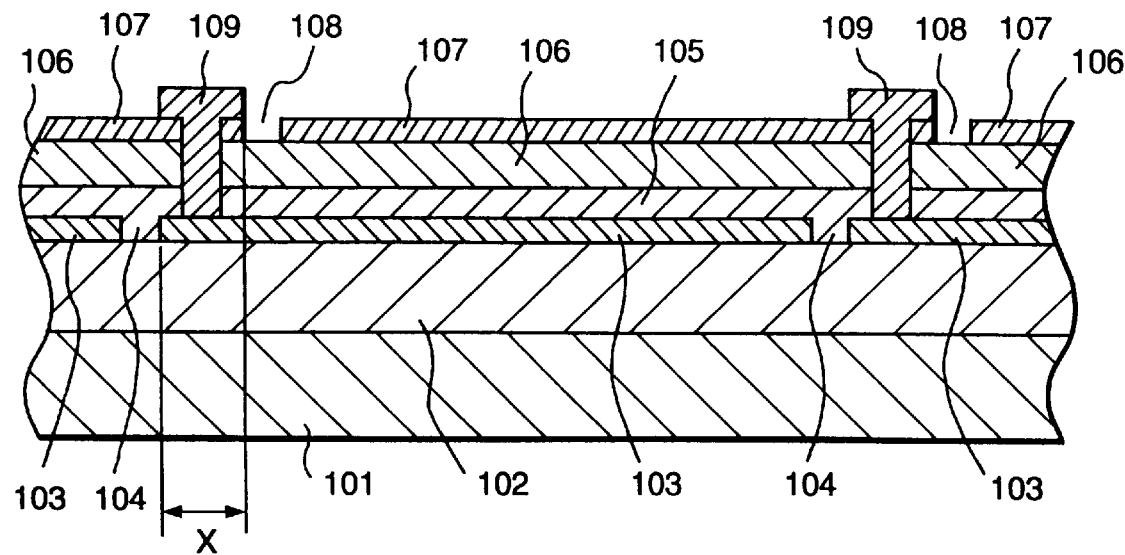
FIG. 2 is a view showing the second example of a partial sectional structure of a series photovoltaic element array in which a transparent layer is formed after the formation of first electrodes.

In the structure shown in FIG. 2, a stainless steel plate with dimensions of 10 cm×10 cm and a thickness of 0.2 mm was used as a substrate 101. This substrate had a sufficient flexibility. An $SiO_x$ film with a thickness of about 0.5 μm was deposited as an insulating layer 102 on the substrate 101 by sputtering using silica glass as a target. The resistivity of this $SiO_x$ film was immeasurable, $10^{15}$ Ωcm or higher. Ag with a thickness of about 0.1 μm was deposited as a first electrode 103 on the insulating layer 102 by sputtering. Grooves 104 about 100 μm wide were formed by an Nd-YAG laser beam (second harmonic). Consequently, the first electrode layer of Ag was divided into ten portions at intervals of about 1 cm by these grooves 104. On top of the resultant structure, ZnO with a thickness of 0.5 μm was deposited as a transparent layer 105 by sputtering using ZnO as a target and Ar and $O_2$ as atmospheric gases. At the same time, ZnO was deposited on a glass substrate and the resistivity of ZnO was measured.

A photovoltaic layer 106 of amorphous silicon hydride (a-Si:H) was deposited by glow discharge decomposition. This photovoltaic layer 106 consisted of an n layer doped with phosphorus (P) as an impurity and having a thickness of about 20 nm, an i layer not doped with any impurity and having a thickness of about 500 nm (=0.5 μm), and a p layer doped with boron (B) as an impurity and having a thickness of about 10 nm. In addition, ITO (indium tin oxide) with a thickness of about 65 nm was deposited as a second electrode 107 on the photovoltaic layer 106 by RF sputtering. The thickness of this second electrode 107 was so set that the second electrode 107 also functioned as an antireflection film. Grooves 108 about 100 μm wide were formed by an Nd-YAG laser beam (fundamental wave) to divide the second electrode layer of ITO into ten portions at intervals of about 1 cm. The distance between the groove 104 and the groove 108 was about 300 μm (=X).

Finally, grooves reaching the first electrodes 103 were formed between the grooves 104 and the grooves 108 by an Nd-YAG laser beam (second harmonic), and a filling material 109, i.e., an Ag paste, was filled in these grooves by screen printing.

In this manner, a photovoltaic element array in which ten photovoltaic elements were connected in series was manufactured. Six samples were analogously formed while the ratio (flow rate ratio) of $O_2$ in the atmosphere was changed when the transparent layer 105 was deposited.

The photoelectric conversion characteristics of the six samples thus manufactured were measured with an AM-1.5 solar simulator, and the conversion efficiencies were evaluated. FIG. 9 shows the evaluation results.

Separately, a unit element with an area of 1 $cm^2$ was formed as a standard sample by depositing ITO by using a mask, and the conversion efficiency was evaluated. In series photovoltaic element arrays such as the samples described above, losses are produced by the area of the grooves formed in the first electrodes 103 and the second electrodes 107 or the grooves in which the conductive material 109 is filled or by the area of the region with the width X between these grooves. Therefore, even if the grooves or the electrical connecting portions are ideally formed, the conversion efficiency as a solar battery is slightly lower than that of the standard sample.

As shown in FIG. 9, it is considered that in the sample of ZnO with a low resistivity (ρ=0.7 Ωcm), an open circuit voltage $V_{oc}$ was decreased due to large leakage between adjacent unit elements. On the other hand, it is considered that in the sample of ZnO with a high resistivity (ρ=1.1 kΩcm), the influence of the energy loss when a current flowed through the ZnO transparent layer 105 appeared. Consequently, as in FIG. 9, the characteristics can be optimized by controlling the resistivity of ZnO. That is, a series photovoltaic element array having a conversion efficiency nearly equivalent to that of the standard element can be obtained by setting the ratio (flow rate ratio) of $O_2$ in the atmosphere to 2% to 3% when the transparent layer 105 is deposited and setting the resistivity ρ of the transparent layer 105 to about 30 to 110Ω.

Experiment 2

The influence of the formation of the transparent layer 105 on the yield was checked. On the basis of the results of Experiment 1, sample 1 of Experiment 2 was formed by depositing ZnO by setting the $O_2$ flow rate ratio to 2%. Subsequently, sample 2 having the structure shown in FIG. 8 was formed. That is, this sample 2 was formed following the same procedure as sample 1 except that after a transparent layer 805 was deposited, grooves 804 were formed in the transparent layer 805 and a first electrode 803 by a laser beam. In addition, sample 3 was formed following the same procedure as sample 1 except that the transparent layer 105 was not deposited.

Ten pieces of each of these samples 1 to 3 were formed, and the characteristics were checked and the yields were evaluated in the same manner as in Experiment 1. FIG. 10 shows the evaluation results. "Yield" means the ratio of sample pieces having Fill Factor (FF) of 45% or more. FF was about 60% in the standard sample using the same photovoltaic layer and decreased when the element had defects. Of the ten pieces of each sample, the characteristics of the top three pieces with good characteristics were averaged. Consequently, it can be concluded that defects had almost no influence of the characteristics of these top three sample pieces.

FIG. 10 shows that the yield of sample 2 was lower than that of sample 3 as well as that of sample 1. This reason is assumed that the grooves 804 were formed in the transparent layer 805 in this sample 2 as described above. Sample 1 in which no grooves were formed in the transparent layer 105 had the highest yield. In sample 3 in which the transparent layer 105 was not deposited, the output current was small and the characteristics were unsatisfactory.

SUMMARY

The results of Experiments 1 and 2 above demonstrate that when the structure shown in FIG. 1 or 2 is used, a series photovoltaic element array can be manufactured with a higher yield and a higher conversion efficiency than when the structure shown in FIG. 8 is used.

Components

The details of the individual components suitable to practice the present invention will be described below.

Substrate

Various metal plates can be used as a substrate for forming the photovoltaic element array according to the present invention. Among all metal plates, a stainless steel plate, a zinc steel plate, an aluminum plate, and a copper plate are preferable because these metal plates are relatively inexpensive. These metal plates can be cut into a predetermined shape before being used or can be used in the form of a long sheet. Long sheets are suitable for continuous production and readily storable and transportable because they can be wounded into coils. The surface of the substrate can be polished. However, a well-finished substrate, e.g., a bright-annealed stainless steel plate, can also be directly used.

Insulating Layer

An insulating layer for forming the photovoltaic element array according to the present invention must have a resistivity of at least $10^{10}$ Ωcm, and preferably $10^{12}$ Ωcm or more, when irradiated with light. Also, the insulating layer must resist the temperature (usually 200° C. or higher) applied during the deposition of electrodes or semiconductors and the temperature (expected to be instantaneously about 1000° C.) applied during the laser beam processing. Due to these limitations, it is necessary to select the material of the insulating layer from inorganic substances.

In addition, the thermal conductivity of the insulating layer has a large influence on the processability of a laser beam. Examples of the insulating layer are a diamond film, a silicon film, a silicon carbide film (composition ratio of C=0.2 or less), an alumina film, a silicon nitride film, a calcium fluoride film, and a silicon oxide film. Any of these films can be deposited on a substrate by using, e.g., sputtering, plasma CVD, or ion plating.

Metal Layer

As the first electrode serving as a metal layer for forming the photovoltaic element array according to the present invention, it is preferable to use a metal with a high reflectance such as Ag or Al. As described earlier, however, the reflectance need not be high to light whose wavelength is shorter than 0.5 μm. On the contrary, in this wavelength range, a low reflectance is advantageous to laser beam processing since a YAG laser beam (second harmonic) is absorbed well with a low reflectance. From this point of view, Cu is a suitable material.

Cu can also be formed into an alloy to increase the hardness or improve the stability at a high humidity.

Examples of the other metal of the alloy are Ag, Al, Be, Ni, Sn, and Zn. The alloy can be suitably used within the composition range of about 0.1 to 30 wt % without largely impairing the reflectance. Any of these films can be deposited on a substrate by, e.g., plating, sputtering, plasma CVD, or ion plating.

As described previously, to confine incident solar light into a photovoltaic layer, it is desirable to form corrugations on the surface of the metal layer. The corrugations can be developed by raising the substrate temperature during the deposition of the first electrode.

Transparent Layer

As the material of a transparent layer for forming the photovoltaic element array according to the present invention, it is possible to use metal oxides such as tin oxide ($SnO_x$), zinc oxide ($ZnO_x$), cadmium oxide (CdO), and cadmium stannate ($Cd_2SnO_4$). The resistivities of these materials can be controlled by adjusting the oxygen concentration in the atmosphere of deposition such as explained in Experiment 1 or by introducing a dopant. For $SnO_x$ whose resistivity is high when undoped, effective dopants are fluorine (F), phosphorus (P), and antimony (Sb) since these dopants decrease the resistivity. For $ZnO_x$ whose resistivity is low when undoped, copper (Cu) is effective to increase the resistivity. As in the case of the metal layer, corrugations can also be formed on the surface of the transparent layer in order to confine incident solar light into a photovoltaic layer. These corrugations can be developed by raising the substrate temperature during the deposition of the transparent layer. The resistivity of the transparent layer has already been described in detail.

The present inventor has further studied the material of the transparent layer and found a suitable transparent layer for forming a series photovoltaic element array having the structure shown in FIG. 2. That is, as described earlier, the first electrodes 103 and the transparent layer are required to have a function of returning light not completely absorbed by the photovoltaic layer 106 to the photovoltaic layer 106. Generally, a semiconductor material tends to absorb light with a shorter wavelength more strongly. As an example, amorphous silicon hydride (a-Si:H) about 0.5 μm thick which is often used as a thin-film semiconductor for a solar battery almost completely absorbs light whose wavelength is shorter than 0.5 μm. In practice, therefore, light with this wavelength does not reach the first electrodes 103. However, as the wavelength becomes longer than 0.5 μm, the ratio of light transmitting through the a-Si:H film increases accordingly. When the wavelength is about 0.7 μm, 50% or more of light transmits through the a-Si:H film.

In order for the transparent layer 105 to guide the transmitted light to the surface of the first electrode 103 without producing any loss, it is desirable that the material of the transparent layer 105 have a high transmittance to light having this wavelength. To minimize the loss of the transmitted light, $SnO_x$ or $ZnO_x$ is often used as the material of the transparent layer 105. These metal oxides have a transmittance of about 85% or higher to a wavelength of 0.7 μm and hence are convenient to decrease the loss of the transmitted light. However, these metal oxides are inconvenient to perform laser processing because they exhibit a transmittance of 85% or higher to most visible light.

Presently, an Nd-YAG laser is almost exclusively used in laser beam processing in the manufacture of solar batteries. Since the wavelength of the fundamental wave of this Nd-YAG laser is 1.06 μm, the Nd-YAG laser is often used with this wavelength. However, the second harmonic with a wavelength of 0.53 μm can also be used.

The following features can be achieved by the use of the second harmonic of the Nd-YAG laser. As described above, light having a wavelength of about 0.53 μm is in many instances absorbed by the photovoltaic layer 106. Accordingly, the material of the transparent layer 105 need not have a high transmittance to light having a shorter wavelength than the second harmonic of the Nd-YAG laser. In contrast, if the transmittance is low to light having a shorter wavelength than the second harmonic of the Nd-YAG laser (i.e., if the absorption of the light is large), the absorption of the second harmonic of the Nd-YAG laser increases, so that the intensity of a laser beam necessary to process the transparent layer can be low. Eventually, the first electrode 103 and the insulating layer 102 are less damaged. Selenium oxide is an example of the material. Therefore, zinc selenium can be used as the material of the transparent layer 105.

Laser Beam Processing

Laser beam processing for forming the photovoltaic element array according to the present invention can be performed by using, e.g., a YAG laser (principal oscillation wavelength 1.06 μm), a $CO_2$ laser (principal oscillation wavelength 10.6 μm), or an excimer laser (principal oscillation wavelength 0.19 μm). These lasers have different oscillation wavelengths and different characteristic features. However, the YAG laser is most often used in the processing of solar batteries because a high output can be obtained, the laser is stable, and the laser apparatus is relatively inexpensive.

In addition to the principal oscillation wavelength of 1.06 μm, the second harmonic (oscillation wavelength 0.53 μm) of the YAG laser can also be used if a nonlinear optical element is used together with the laser. Although the YAG laser can continuously oscillate, Q-switching pulse oscillation of the laser is often used to obtain a high peak power. The frequency of this Q-switching pulse oscillation is a few kHz to a few tens of kHz, and the duration of one pulse is about 100 ns. As an oscillation mode, a TEM00 mode is readily usable because an intensity distribution inside a beam is in shape.

Figure 6:
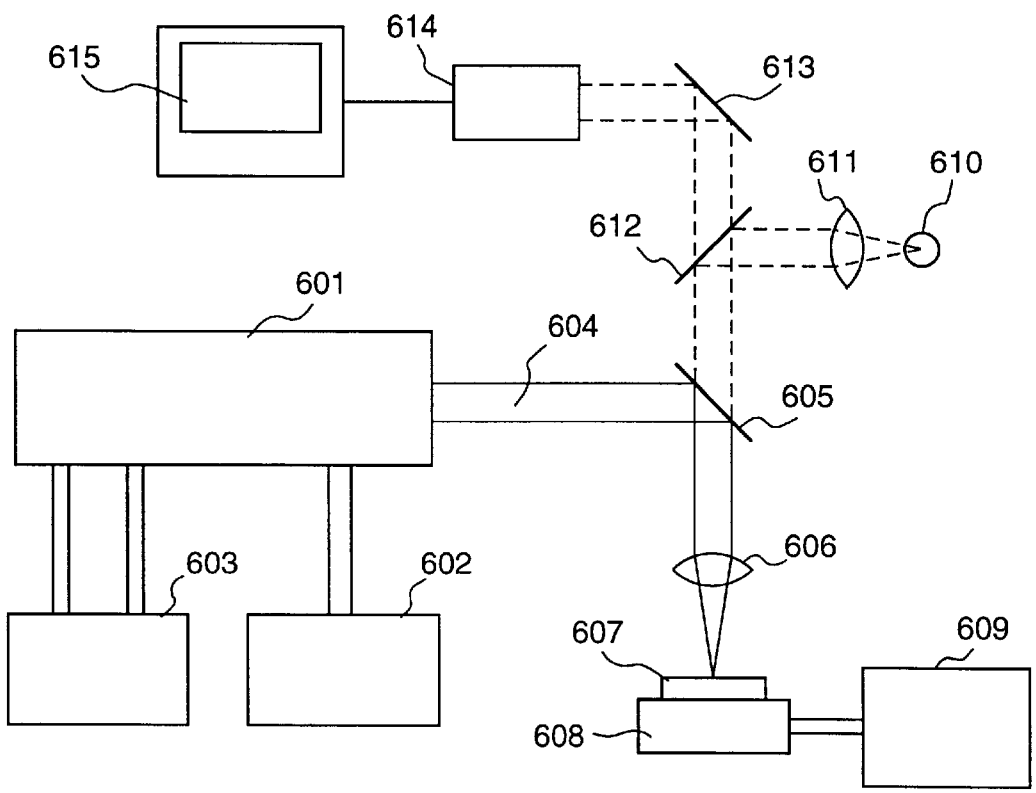
FIG. 6 is a view showing the outline of a laser processing optical system.

FIG. 6 shows the outline of an optical system for laser beam processing. A laser main body 601 incorporates a Q switch or a nonlinear optical element where necessary. A power supply 602 turns on a laser exciting light source. A cooling device 603 circulates cooling water. The traveling direction of an output laser beam 604 is bent 90° by a dichroic mirror 605, and the laser beam 604 is focused on a sample 607 by a lens 606. The sample 607 is placed on a stage 608, and the stage 608 moves in a horizontal direction perpendicular to the incident direction of the laser beam 604 at a velocity determined by a controller 609. Accordingly, the laser beam 604 is scanned on the surface of the sample 607.

If the sample 607 is large, the laser beam can also be scanned by using a polygonal mirror while the sample 607 is fixed.

Output light from an illuminating light source 610 is collimated by a lens 611. The traveling direction of the collimated light is bent 90° by a dichroic mirror 612, and the light illuminates the sample 607. The reflected light by this illumination is input to an ITV camera 614 via a mirror 613. Accordingly, the operator can observe the state of laser beam processing on a monitor connected to the ITV camera 614 in the same place as the processing.

Fabrication Method

Methods of fabricating the photovoltaic element array according to the present invention will be described below. However, the present invention is not limited to the fabrication methods described below.

First Embodiment

Figure 3A:
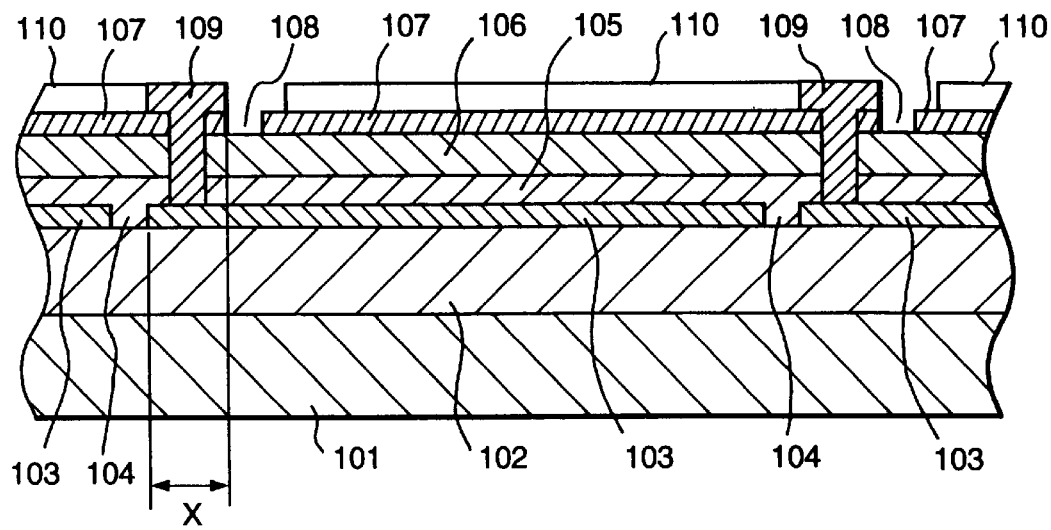
FIGS. 3A and 3B are views showing the structure of a photovoltaic element array in which grid electrodes are formed on second electrodes.
Figure 3B:
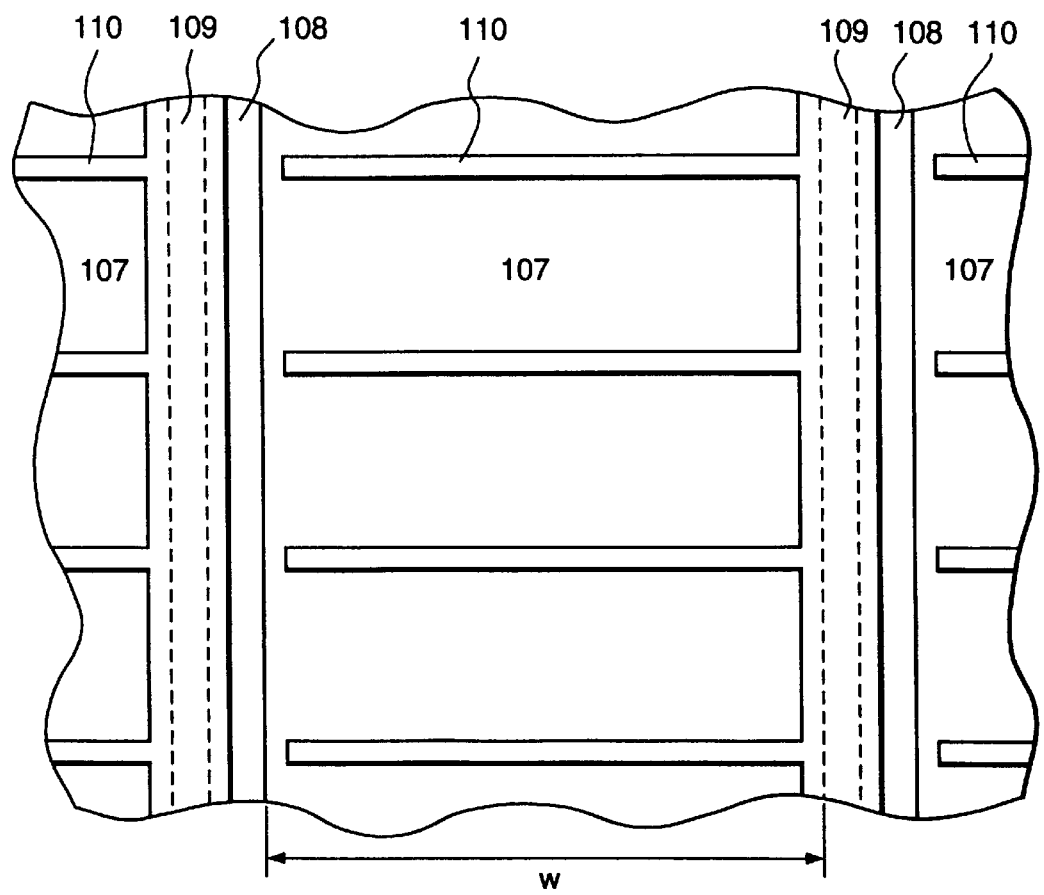

In the first embodiment, a photovoltaic element array in which grid electrodes 110 are formed on second electrodes 107 as shown in FIGS. 3A and 3B will be described below. FIG. 3A is a sectional view and FIG. 3B is a plan view. The structure of the photovoltaic element array shown in FIGS. 3A and 3B is the same as the structure of the photovoltaic element array shown in FIG. 2 except for the grid electrodes 110.

Figure 11:
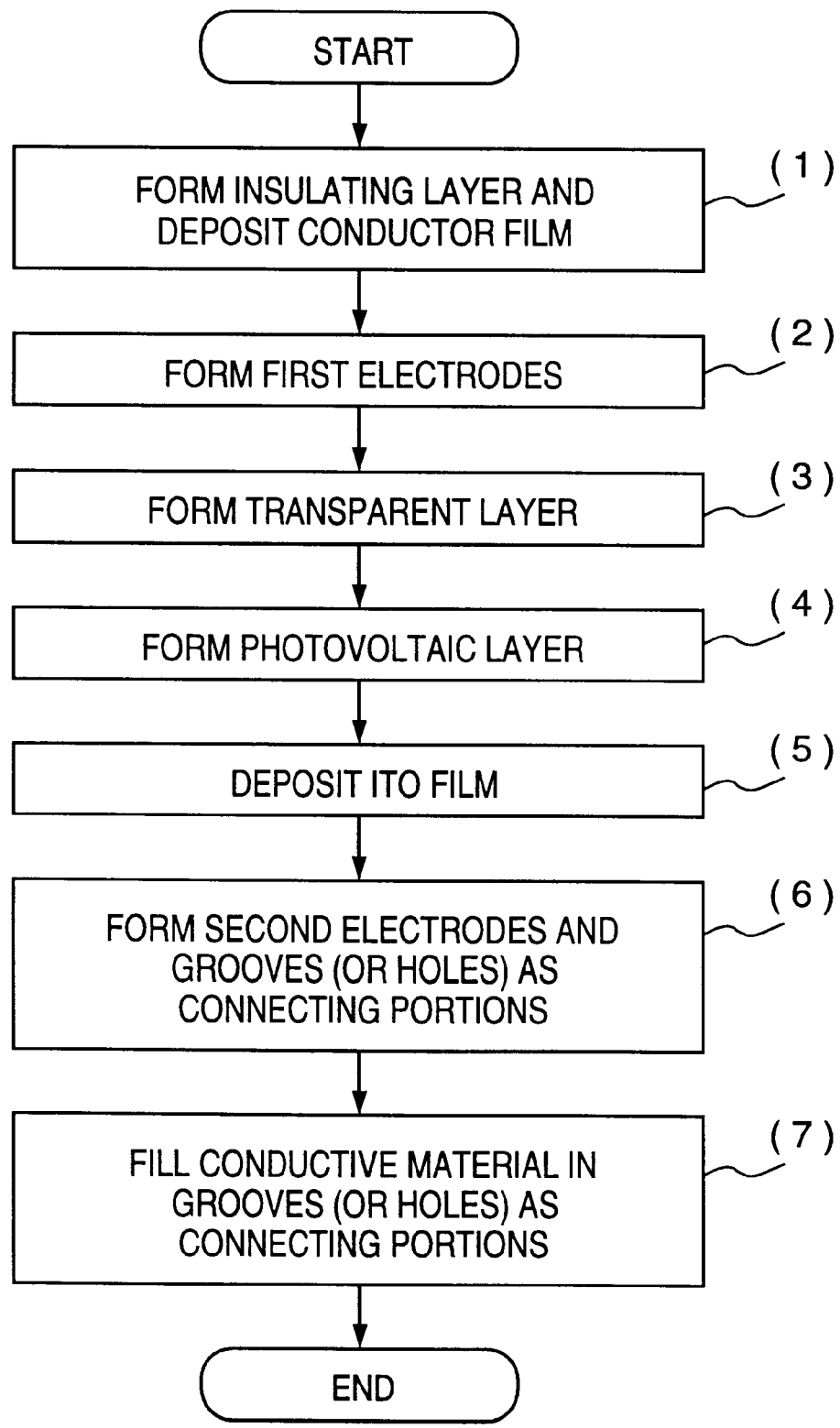
FIG. 11 is a flow chart showing a procedure of fabricating a photovoltaic element array of the first embodiment.

The photovoltaic element array of the first embodiment will be described below with reference to a fabrication procedure shown in FIG. 11.

(1) A stainless steel plate with dimensions of 10 cm×30 cm and a thickness of 0.2 mm is used as a substrate 101. This substrate 101 is set in a DC magnetron sputtering apparatus. An SiC film about 1.0 μm thick is deposited as an insulating film 102 by using a polycrystalline silicon target and argon (Ar), ethylene ($C_2H_4$), and hydrogen ($H_2$) as atmospheric gases. An Ag film about 0.1 μm thick for forming first electrodes 103 is deposited by using an Ag target and Ar as an atmospheric gas.

(2) The substrate 101 on which the Ag film is deposited in step (1) above is set on a stage 608 of the laser processor shown in FIG. 6. While an Nd-YAG laser is oscillated, the stage 608 is moved to scan the laser beam, thereby forming a plurality of grooves 104 about 100 μm wide in the Ag film. Consequently, the Ag film is divided into ten portions at intervals of about 3 cm, forming the first electrodes 103.

(3) On the first electrodes, a 0.3-μm thick ZnO film is deposited as a transparent layer 105 by using a zinc oxide (ZnO) target and Ar as an atmospheric gas.

(4) On the transparent layer 105, a photovoltaic layer 106 made from an amorphous silicon semiconductor is deposited. More specifically, the sample is set in a parallel-plate capacitive coupling glow discharge apparatus, and the pressure is adjusted to 1 Torr by flowing silane ($SiH_4$), phosphine ($PH_3$), and hydrogen ($H_2$). The sample is heated to 250° C., and an RF voltage is applied between the electrodes of the discharge apparatus to generate a glow discharge plasma, thereby depositing a phosphorus (P)-doped n layer about 20 nm thick. Subsequently, the pressure is adjusted to 1 Torr by flowing silane ($SiH_4$) and hydrogen ($H_2$), the sample is heated to 200° C., and an RF voltage is applied between the electrodes of the discharge apparatus to generate a glow discharge plasma, thereby depositing a 400 nm thick i layer. Additionally, the pressure is adjusted to 1 Torr by flowing silane ($SiH_4$), diborane ($B_2H_6$), and hydrogen ($H_2$), the sample is heated to 150° C., and an RF voltage is applied between the electrodes of the discharge apparatus to generate a glow discharge plasma, thereby depositing a boron (B)-doped p layer about 10 nm thick. It was found by an electron diffraction experiment that the p layer was finely crystallized.

(5) In the DC magnetron sputtering apparatus, an ITO film about 65 nm thick for forming second electrodes 107 is deposited on the photovoltaic layer by using an ITO (indium tin oxide) target and Ar as an atmospheric gas. The thickness of this ITO film is so set that the film also functions as an antireflection film.

(6) The substrate 101 on which the ITO film is deposited in step (5) above is set again in the laser processor shown in FIG. 6, and grooves 108 are formed in the ITO film. More specifically, while the Nd-YAG laser is oscillated, the stage 608 is moved to scan the laser beam, forming the grooves 108 about 100 μm wide and dividing the ITO film into ten portions at intervals of about 3 cm. Also, the distance between the groove 108 and the groove 104 adjacent to each other is set to approximately 300 μm (=X). Finally, grooves reaching the first electrodes 103 are formed between the grooves 104 and the grooves 108 by using the Nd-YAG laser beam (second harmonic).

(7) An Ag paste as a conductive material 109 is filled by screen printing in the grooves formed in step (6) above and reaching the first electrodes 103, thereby electrically connecting the transparent layer 105 and the second electrodes 107. When the Ag paste is screen-printed, grid electrodes 110 are formed by forming a comb-like pattern as shown in FIG. 3B on the second electrodes 107. Since the grid electrodes 110 intercept incident light, output currents are lost accordingly. However, the loss can be reduced by collecting the output currents by using the grid electrodes 110 because the resistance of the ITO film of the second electrodes 107 is not sufficiently low. Therefore, the resistance of the second electrodes 107 can be apparently reduced by the formation of the grid electrodes 110, and so a width w of the first electrode 103 or the second electrode 107 can be increased. Consequently, the amount of incident light intercepted by the grid electrodes 110 can be well compensated.

The photovoltaic element array fabricated by connecting ten photovoltaic elements in series in steps (1) to (7) described above was evaluated by using an AM-1.5 solar simulator with a radiant flux of 100 mW/cm$^2$. Consequently, the conversion efficiency was nearly the same as when unit elements with an area of 1 cm$^2$ were connected in series. For comparison, a sample having the structure shown in FIG. 8 in which grooves were formed in the transparent layer 105 was formed, and it was found that the yield was significantly low in this sample. Also, the conversion efficiency was low in a sample in which the transparent layer 105 was not formed. Accordingly, it turned out that the structure of the series photovoltaic element array according to the present invention was superior.

Second Embodiment

Figure 4:
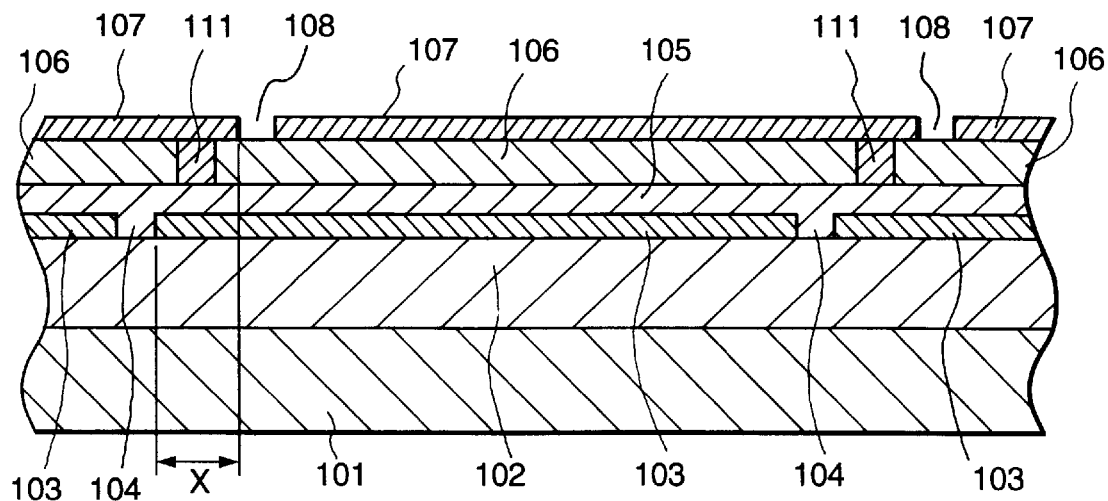
FIG. 4 is a view showing the structure of a photovoltaic element array in which portions of a photovoltaic layer are changed into electrical connecting portions by decreasing the resistance of these portions.

In the second embodiment, a photovoltaic element array in which the resistance of portions of a photovoltaic layer is reduced to form electrical connecting portions as shown in FIG. 4 will be described.

Figure 12:
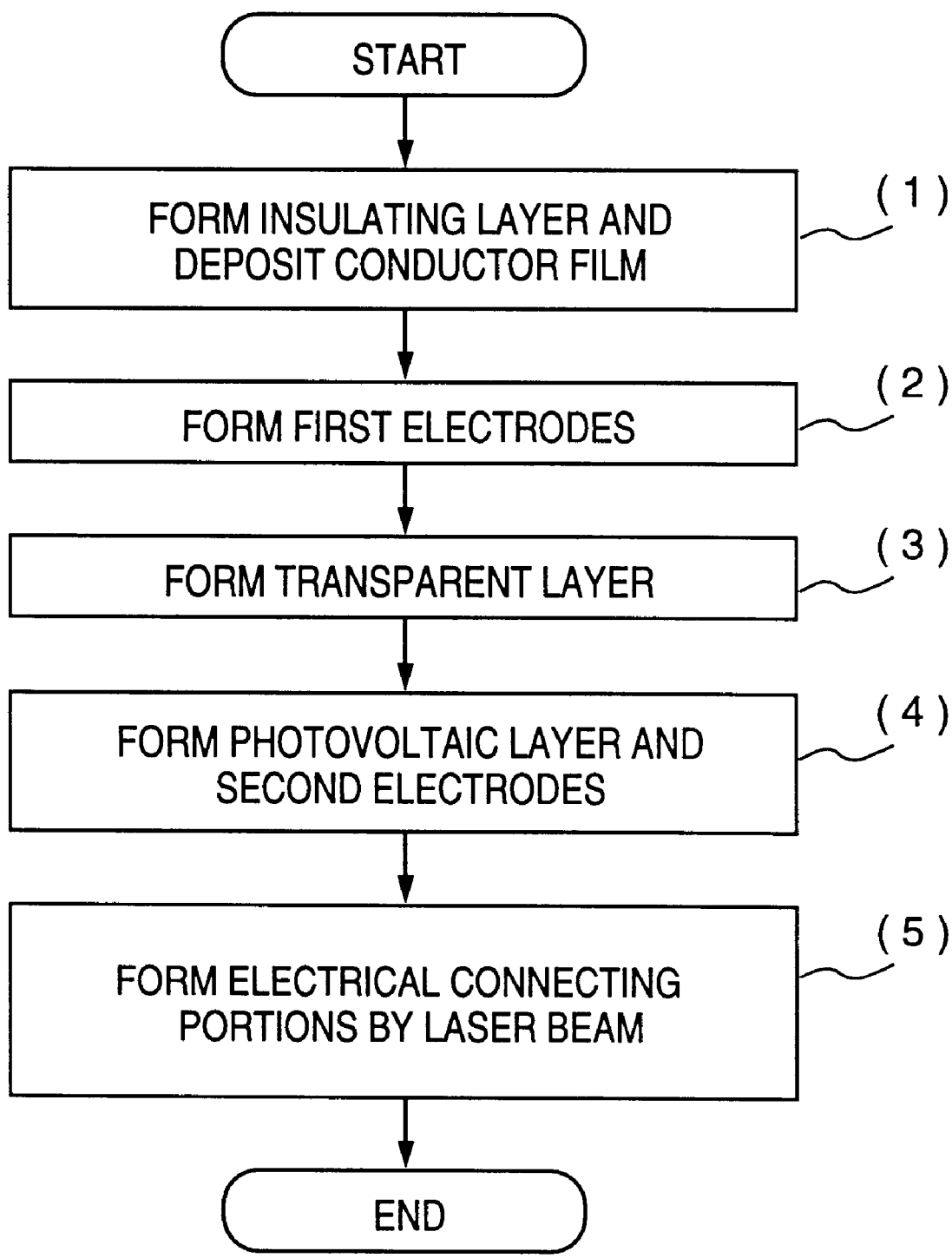
FIG. 12 is a flow chart showing a procedure of fabricating a photovoltaic element array of the second embodiment.

The photovoltaic element array of the second embodiment will be described below with reference to a fabrication procedure shown in FIG. 12.

(1) A stainless steel plate with dimensions of 10 cm×10 cm and a thickness of 0.2 mm is used as a substrate 101. This substrate 101 is set in an ECR discharge apparatus. While ethylene (C$_2$H$_4$) and hydrogen (H$_2$) are flowed, microwaves of a frequency of 2.45 GHz are supplied to raise the substrate temperature to 500° C., thereby depositing a diamond film about 0.7 μm thick as an insulating layer 102. Subsequently, a Cu film about 0.1 μm thick for forming first electrodes 103 is deposited by using a copper (Cu) target and Ar as an atmospheric gas.

(2) A plurality of grooves 104 about 100 μm wide are formed in the Cu film deposited in step (1) above by using the laser processor shown in FIG. 6, thereby cutting the Cu film into ten portions at intervals of about 1 cm to form the first electrodes 103. Since Cu is used as the first electrodes 103, the intensity of a laser beam necessary to process the grooves 104 can be lower than that in the first embodiment.

(3) On the first electrodes 103 formed in step (2) above, a ZnO film about 0.5 μm thick is deposited as a transparent layer 105 by using a zinc oxide (ZnO) target and Ar as an atmospheric gas.

(4) Following the same procedure as in the first embodiment, a photovoltaic layer 106 is formed on the transparent layer 105 formed in step (3) above, an ITO film is deposited, and grooves 108 are formed to form second electrodes 107. As the i layer of the photovoltaic layer 106, amorphous silicon germanium (a-SiGe:H) formed by flowing germane (GeH$_4$) in addition to SiH$_4$ and H$_2$ is used.

(5) The a-SiGe:H is crystallized and its resistance is reduced by irradiating an Nd-YAG laser beam (second harmonic) on the photovoltaic layer 106 formed in step (4) above, thereby forming electrical connecting portions 111 for electrically connecting the transparent layer 105 and the second electrodes 107. In this method, no screen printing is necessary to form the electrical connecting portions, and this simplifies the fabrication steps. Also, since a-SiGe:H is used as the photovoltaic layer 106, it is possible to use light having a longer wavelength than when a-Si:H is used. Consequently, a larger output current can be obtained.

The photovoltaic element array fabricated by connecting ten photovoltaic elements in series in steps (1) to (5) described above was evaluated by using an AM-1.5 solar simulator with a radiant flux of 100 mW/cm$^2$. The conversion efficiency was found to be exactly the same as when unit elements with an area of 1 cm$^2$ were connected in series.

Third Embodiment

Figure 5:
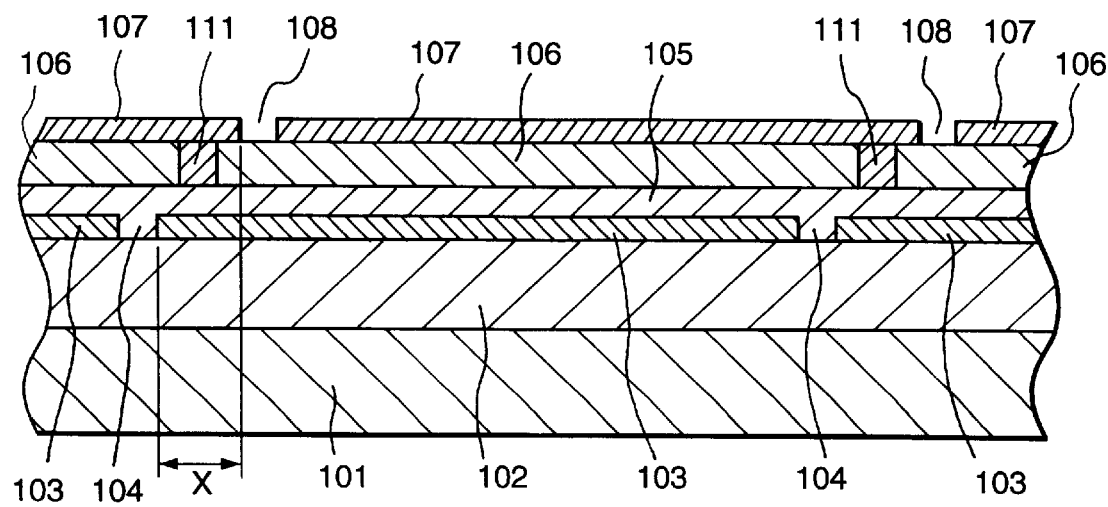
FIG. 5 is a view showing the structure of a photovoltaic element array fabricated by using a roll-to-roll apparatus.

In the third embodiment, a method of fabricating a photovoltaic element array having a structure shown in FIG. 5 by using a roll-to-roll apparatus will be described below.

The photovoltaic element array of the third embodiment will be described below with reference to a fabrication procedure shown in FIG. 13.

(1) A stainless steel plate 10 cm wide, 300 m long, and 0.1 mm thick is washed with an alkaline washing solution (temperature 60° C.), rinsed with ion exchange water, dried by warm air, and wound into a coil. This coil is used as a substrate 101.

Figure 7:
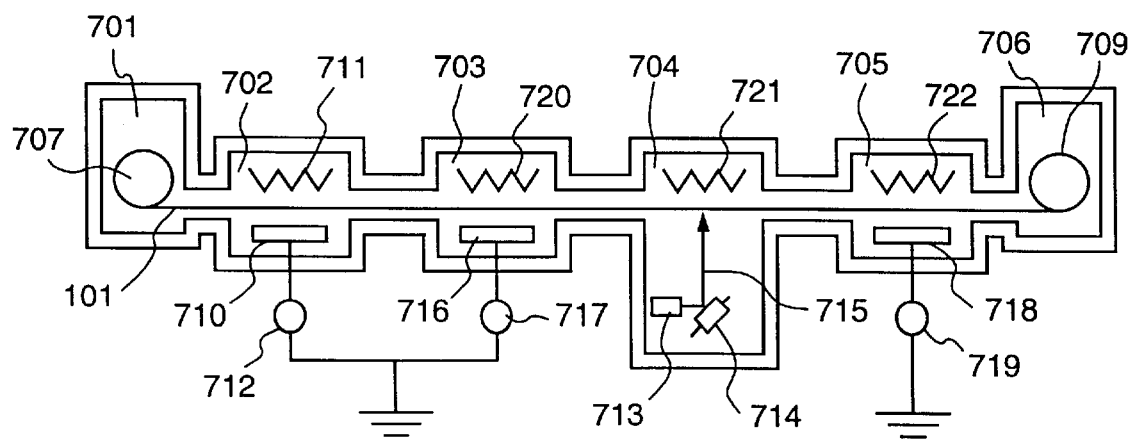
FIG. 7 is a view showing the arrangement of a roll-to-roll sputtering apparatus.

(2) On the substrate 101, an insulating layer 102 and a film for forming first electrodes 103 are deposited by using a roll-to-roll sputtering apparatus shown in FIG. 7. More specifically, a roll 707 of the stainless steel substrate 101 is set in a feed chamber 701. The substrate 101 is fed at a fixed velocity and wound into a coil 709 in a wind-up chamber 701. In a deposition chamber 702, a polycrystalline silicon target 710 is applied with a DC voltage from a power supply 712, and argon (Ar), ethylene (C$_2$H$_4$), and hydrogen (H$_2$) are supplied as atmospheric gases. The substrate 101 is heated to 300° C. from its lower surface by a heater 711, thereby depositing an SiC film about 1.0 μm thick. This SiC film servers as the insulating layer 102. In a deposition chamber 703, a Cu target 716 is applied with a voltage from a power supply 717, Ar is supplied as an atmospheric gas, and the substrate 101 is heated to 300° C. from its lower surface by a heater 720, thereby depositing a 1.0-μm thick Cu film on the SiC film. This Cu film serves as the first electrodes 103.

(3) In a laser processing chamber 704, while an output laser beam 715 from an Nd-YAG laser 713 is scanned in the widthwise direction of the substrate 101 by a polygonal mirror 714, the rotation angle of the polygonal mirror 714 and the pulse oscillation timing are synchronized. In this manner, a plurality of grooves 104 about 100 μm wide extending in the longitudinal direction of the substrate 101 are formed to divide the Cu film into ten portions at intervals of about 1 cm, forming the first electrodes 103.

(4) In a deposition chamber 705, a zinc oxide (ZnO) target 718 is applied with a voltage from a power supply 719, and Ar is supplied as an atmospheric gas. The substrate 101 is heated from its lower surface by a heater 722 to deposit a ZnO film about 0.5 μm thick on the first electrodes 103. This ZnO film serves as a transparent layer 105.

(5) Subsequently, a tandem photovoltaic layer 106 is deposited by using a roll-to-roll glow discharge deposition apparatus as disclosed in U.S. Pat. No. 4,369,730. The tandem photovoltaic layer 106 is formed by stacking a bottom cell in which amorphous silicon germanium (a-SiGe:H) deposited by flowing germane ($GeH_4$) in addition to $SiH_4$ and $H_2$ is used as an i layer, and a top cell in which amorphous silicon (a-SiGe:H) is used as an i layer. In the tandem photovoltaic element, the top cell primarily absorbs light having a wavelength shorter than 500 nm of incident solar light, and the bottom cell absorbs light having a wavelength longer than 500 nm which is not completely absorbed by the top cell. Accordingly, the incident solar light can be efficiently used. Also, a high output voltage can be obtained because the two cells, the top and bottom cells, are connected in series.

(6) After the photovoltaic layer 106 is formed in step (5) above, the substrate is set again in a roll-to-roll sputtering apparatus (having only one deposition chamber). An ITO film about 65 nm thick for forming second electrodes 107 is deposited by using an ITO (indium tin oxide) target and Ar as an atmospheric gas.

(7) After the deposition of the ITO film, the substrate is moved to an adjacent laser processing chamber. A laser beam of an Nd-YAG laser is scanned in the widthwise direction of the substrate 101 to form a plurality of grooves 108 about 100 μm wide extending in the longitudinal direction of the substrate, thereby dividing the ITO film into ten portions at intervals of about 1 cm. Note that the distance between the groove 108 and the groove 104 is set to approximately $300 \mu (=X)$. At the same time, the grooves 108 are formed, a laser beam (second harmonic) of another Nd-YAG laser beam is scanned in the widthwise direction of the substrate to electrically connect the first electrodes 103 and the second electrodes 107 following the same procedure as in the second embodiment.

(8) When the laser processing is completed, the roll of the substrate 101 is cut at intervals of 10 cm.

The 10 cm×10 cm photovoltaic element array fabricated by connecting ten elements in series in steps (1) to (8) described above was evaluated by using an AM-1.5 solar simulator with a radiant flux of 100 mW/cm². The result was that 96% of the samples had a conversion efficiency nearly equivalent to that obtained when unit elements with an area of 1 cm² were connected in series.

Accordingly, it turned out that the series photovoltaic element array according to the present invention also had a high mass-productivity.

In the photovoltaic element array according to the present invention as has been described above, the reflectance of the first electrodes is improved by stacking the transparent layer on the first electrodes, and light transmitted through the semiconductor photovoltaic layer is returned to the photovoltaic layer. Consequently, incident solar light can be efficiently used, and this increases the conversion efficiency. Additionally, the transparent layer is formed after grooves are formed to separate the adjacent first electrodes. This prevents defects from taking place due to the steps in the grooves. Furthermore, the grooves are formed only in the film of the first electrodes, i.e., no grooves need to be formed in the transparent layer. Accordingly, the intensity of a laser beam for forming these grooves can be decreased. This prevents the formation of short circuits that can be formed in the insulating layer of the substrate when the grooves are formed.

According to the present invention, therefore, it is possible to fabricate a series photovoltaic element array having a high conversion efficiency, a high yield, and a high reliability, and this greatly contributes to the spread of solar light electric power generation.

As many apparently widely different embodiments of the present invention can be made without departing from the spirit and scope thereof, it is to be understood that the invention is not limited to the specific embodiments thereof except as defined in the appended claims.

What is claimed is:

1. A device in which a plurality of photovoltaic elements are connected in series, comprising:
    a conductive substrate;
    an insulating layer formed on said substrate;
    a first conductor layer formed on said insulating layer and divided into a plurality of first electrodes by at least one first groove;
    a transparent layer so formed as to cover said first conductor layer and bury said first groove;
    a photovoltaic layer formed on said transparent layer;
    a transparent second conductor layer formed on said photovoltaic layer and divided into a plurality of second electrodes by at least one second groove parallel to said first groove; and
    at least one connecting portion for electrically connecting said first and second electrodes adjacent to each other between said first and second grooves.

2. The device according to claim 1, wherein a resistivity of said transparent layer is 4 Ωcm to 40 kΩcm.

3. The device according to claim 1, wherein a resistivity of said transparent layer is 30 Ωcm to 110 Ωcm.

4. The device according to claim 1, wherein a transmittance of said transparent layer is not less than 85% at a wavelength of 700 nm and not more than 70% at a wavelength of 530 nm.

5. The device according to claim 1, wherein said transparent layer is made from a material selected from the group consisting of tin oxide, zinc oxide, cadmium oxide, cadmium stannate, selenium oxide, and zinc selenide.

6. The device according to claim 1, wherein said substrate is made from a material selected from the group consisting of a stainless steel plate, a zinc steel plate, an aluminum plate, and a copper plate.

7. The device according to claim 1, wherein said insulating layer is made from a material selected from the group consisting of a diamond film, a silicon film, a silicon carbide film, an alumina film, a silicon nitride film, a calcium fluoride film, and a silicon oxide film.

8. The device according to claim 1, wherein said first conductor metal layer is made from a material selected from the group consisting of silver, aluminum, copper, and a copper alloy.

9. The device according to claim 1, wherein at least a portion of said photovoltaic layer is made from non-singlecrystalline silicon or a non-singlecrystalline silicon alloy.

10. The device according to claim 1, wherein said connecting portion is formed by decreasing a resistance of said photovoltaic layer between said first and second grooves.

11. The device according to claim 1, wherein said connecting portion has a groove or a hole piercing at least said second electrode and said photovoltaic layer and said groove or hole is filled with a conductive material.

12. The device according to claim 11, further comprising a plurality of grid-like third electrodes, each of said plurality of third electrodes formed on each of said second electrodes and electrically connected to each of said second electrodes.

13. The device according to claim 12, wherein said third electrodes are formed when said groove or hole is filled with said conductive material.

14. A process for fabricating a device in which a plurality of photovoltaic elements are connected in series, comprising the steps of:

forming an insulating layer on a conductive substrate;

forming a first conductor layer on said insulating layer;

forming at least one groove in said first conductor layer to divide said first conductor layer into a plurality of first electrodes;

forming a transparent layer so that said transparent layer covers said first conductor layer and buries said first groove;

forming a photovoltaic layer on said transparent layer;

forming a transparent second conductor layer on said photovoltaic layer;

forming at least one second groove parallel to said first groove in said second conductor layer to divide said second conductor layer into a plurality of second electrodes; and forming at least one connecting portion for electrically connecting said first and second electrodes adjacent to each other between said first and second grooves.

15. The process according to claim 14, wherein the connecting portion formation step comprises forming said connecting portion by decreasing a resistance of a portion of said photovoltaic layer by irradiating a laser beam onto said photovoltaic layer between said first and second grooves.

16. The process according to claim 14, wherein the connecting portion formation step comprises forming a groove or a hole through at least said second electrode and said photovoltaic layer, and filling a conductive material in said groove or hole.

17. The process according to claim 14, wherein the connecting portion formation step comprises forming a plurality of grooves or holes, each of said plurality of grooves or holes through at least said second electrode and said photovoltaic layer, filling a conductive material in said plurality of grooves or holes, and forming a plurality of grid-like third electrodes, each of said plurality of third electrodes formed on each of said second electrodes and electrically connecting each of said plurality of third electrodes to each of said second electrodes.

* * * * *

UNITED STATES PATENT AND TRADEMARK OFFICE
CERTIFICATE OF CORRECTION

PATENT NO. : 6,080,928
DATED : June 27, 2000
INVENTOR(S) : Katsumi Nakagawa

It is certified that error appears in the above-identified patent and that said Letters Patent is hereby corrected as shown below:

Title page,
Insert -- [*] Notice: This patent issued on a continued prosecution application filed under 37 CFR 1.53 (d), and subject to the twenty year patent term provisions of 35 U.S.C. 154 (a) (2). --;

Item [56] References Cited, U.S. PATENT DOCUMENTS, insert: -- 5,536,333 7/1996 Foote et al. .....136/260 --; and OTHER PUBLICATIONS, after "Patent Abstracts" (second occurrence) "JP-061963" should read -- JP-1-061963 --; and Item [57] ABSTRACT, "17 Claims," should read -- 33 Claims, --.

Drawings, Sheet 6 of 10,
FIG. 9, "$O_2$FROW" should read -- $O_2$FLOW --.

Column 9,
Line 33, "wounded" should read -- wound --.

Column 10,
Line 36, "layer" should read -- layer 105 --.

Column 11,
Line 63, "monitor" should read -- monitor 615 --.

Column 15,
Line 33, "300 $\mu$(=X)." should read -- 300 $\mu m$(=X). --.

Column 18,
Line 23, insert
-- 18. A device in which a plurality of
photovoltaic elements are connected in series, comprising:
    an insulating member;
    a first conductor layer formed on said insulating
member and divided into a plurality of first electrodes by
at least one first groove;
    a transparent layer so formed as to cover said
first conductor layer and bury said first groove;
    a photovoltaic layer formed on said transparent
layer;

UNITED STATES PATENT AND TRADEMARK OFFICE
CERTIFICATE OF CORRECTION

PATENT NO. : 6,080,928
DATED : June 27, 2000
INVENTOR(S) : Katsumi Nakagawa

It is certified that error appears in the above-identified patent and that said Letters Patent is hereby corrected as shown below:

a transparent second conductor layer formed on said photovoltaic layer and divided into a plurality of second electrodes by at least one second groove parallel to said first groove; and
    at least one connecting portion for electrically connecting said first and second electrodes adjacent to each other between said first and second grooves.

19. The device according to claim 18, wherein said transparent layer has a resistivity of 4 $\Omega$cm to 40 k$\Omega$cm.

20. The device according to claim 18, wherein said transparent layer has a resistivity of 30 $\Omega$cm to 110 $\Omega$cm.

21. The device according to claim 18, wherein said transparent layer has a transmittance not less than 85% at a wavelength of 700 nm and not more than 70% at a wavelength of 530 nm.

22. The device according to claim 18, wherein said transparent layer is made from a material selected from the group consisting of tin oxide, zinc oxide, cadmium oxide, cadmium stannate, selenium oxide and zinc selenide.

23. The device according to claim 18, wherein said insulating member is made from a material selected from the group consisting of a diamond film, a silicon film, a silicon carbide film, an alumina film, a silicon nitride film, a calcium fluoride film and a silicon oxide film.

24. The device according to claim 18, wherein said first conductor metal layer is made from a material selected from the group consisting of silver, aluminum, copper and a copper alloy.

25. The device according to claim 18, wherein at least a portion of said photovoltaic layer is made from non-single crystalline silicon or a non-single crystalline silicon alloy.

26. The device according to claim 18, wherein said connecting portion is formed by decreasing a resistance of said photovoltaic layer between said first and second grooves.

27. The device according to claim 18, wherein said connecting portion has a groove or a hole piercing at least said second electrode and said photovoltaic layer and said groove or hole is filled with a conductive material.

UNITED STATES PATENT AND TRADEMARK OFFICE
CERTIFICATE OF CORRECTION

PATENT NO. : 6,080,928
DATED : June 27, 2000
INVENTOR(S) : Katsumi Nakagawa

It is certified that error appears in the above-identified patent and that said Letters Patent is hereby corrected as shown below:

28. The device according to claim 27, further comprising a plurality of grid-like third electrodes, each of said plurality of third electrodes formed on each of said second electrodes and electrically connected to each of said second electrodes.

29. The device according to claim 28, wherein said third electrodes are formed when said groove or hole is filled with said conductive material.

30. A process for fabricating a device in which a plurality of photovoltaic elements are connected in series, comprising the steps of:

forming a first conductor layer on an insulating member;

forming at least one groove in said first conductor layer to divide said first conductor layer into a plurality of first electrodes;

forming a transparent layer so that said transparent layer covers said first conductor layer and buries said first groove;

forming a photovoltaic layer on said transparent layer;

forming a transparent second conductor layer on said photovoltaic layer;

forming at least one second groove parallel to said first groove in said second conductor layer to divide said second conductor layer into a plurality of second electrodes; and forming at least one connecting portion for electrically connecting said first and second electrodes adjacent to each other between said first and second grooves.

31. The process according to claim 30, wherein the connecting portion formation step comprises forming said connecting portion by decreasing a resistance of a portion of said photovoltaic layer by irradiating a laser beam onto said photovoltaic layer between said first and second grooves.

32. The process according to claim 30, wherein the connecting portion formation step comprises forming a groove or a hole through at least said second electrode and said photovoltaic layer, and filling a conductive material in said groove or hole.

UNITED STATES PATENT AND TRADEMARK OFFICE
CERTIFICATE OF CORRECTION

PATENT NO. : 6,080,928
DATED : June 27, 2000
INVENTOR(S) : Katsumi Nakagawa

It is certified that error appears in the above-identified patent and that said Letters Patent is hereby corrected as shown below:

33. The process according to claim 30, wherein the connecting portion formation step comprises forming a plurality of grooves or holes, each of said plurality of grooves or holes through at least said second electrode and said photovoltaic layer, filling a conductive material in said plurality of grooves or holes, and forming a plurality of grid-like third electrodes, each of said plurality of third electrodes formed on each of said second electrodes and electrically connecting each of said plurality of third electrodes to each of said second electrodes. --.

Signed and Sealed this

Twenty-ninth Day of January, 2002

Attest:

Attesting Officer

JAMES E. ROGAN
Director of the United States Patent and Trademark Office